United States Patent [19]
Davies et al.

[11] Patent Number: 5,170,312
[45] Date of Patent: Dec. 8, 1992

[54] PROTECTION CIRCUIT ON A LEAD OF A POWER DEVICE

[75] Inventors: Robert B. Davies; David F. Mietus, both of Tempe; Paul T. Bennett, Phoenix, all of Ariz.

[73] Assignee: Motorola, Inc., Schaumburg, Ill.

[21] Appl. No.: 787,165

[22] Filed: Nov. 4, 1991

[51] Int. Cl.5 .............................................. H02H 3/08
[52] U.S. Cl. .................................. 361/100; 307/303.2
[58] Field of Search ..................... 361/88, 91, 93, 100, 361/101, 103, 54, 56, 57, 58; 357/40, 41, 74, 80, 23.1, 23.13, 23.14; 307/303.1, 303.2

[56] References Cited
U.S. PATENT DOCUMENTS 4,288,829  9/1981  Tango .................................. 361/56
4,818,895  4/1989  Kaufman ........................... 307/303.1
5,023,684  6/1991  Tsunoda ................................. 361/93

Primary Examiner—A. D. Pellinen
Assistant Examiner—Ronald W. Leja
Attorney, Agent, or Firm—Bradley J. Botsch

[57] ABSTRACT

A method for protecting a semiconductor power die has been provided. The method involves inserting an integrated circuit die between the gate lead of a package containing the semiconductor power die and the actual gate terminal of the semiconductor power die. As a result, any current flowing into the gate lead of the package must pass through the integrated circuit die before entering the semiconductor power die. This allows the integrated circuit die to monitor and control the semiconductor power die.

6 Claims, 1 Drawing Sheet

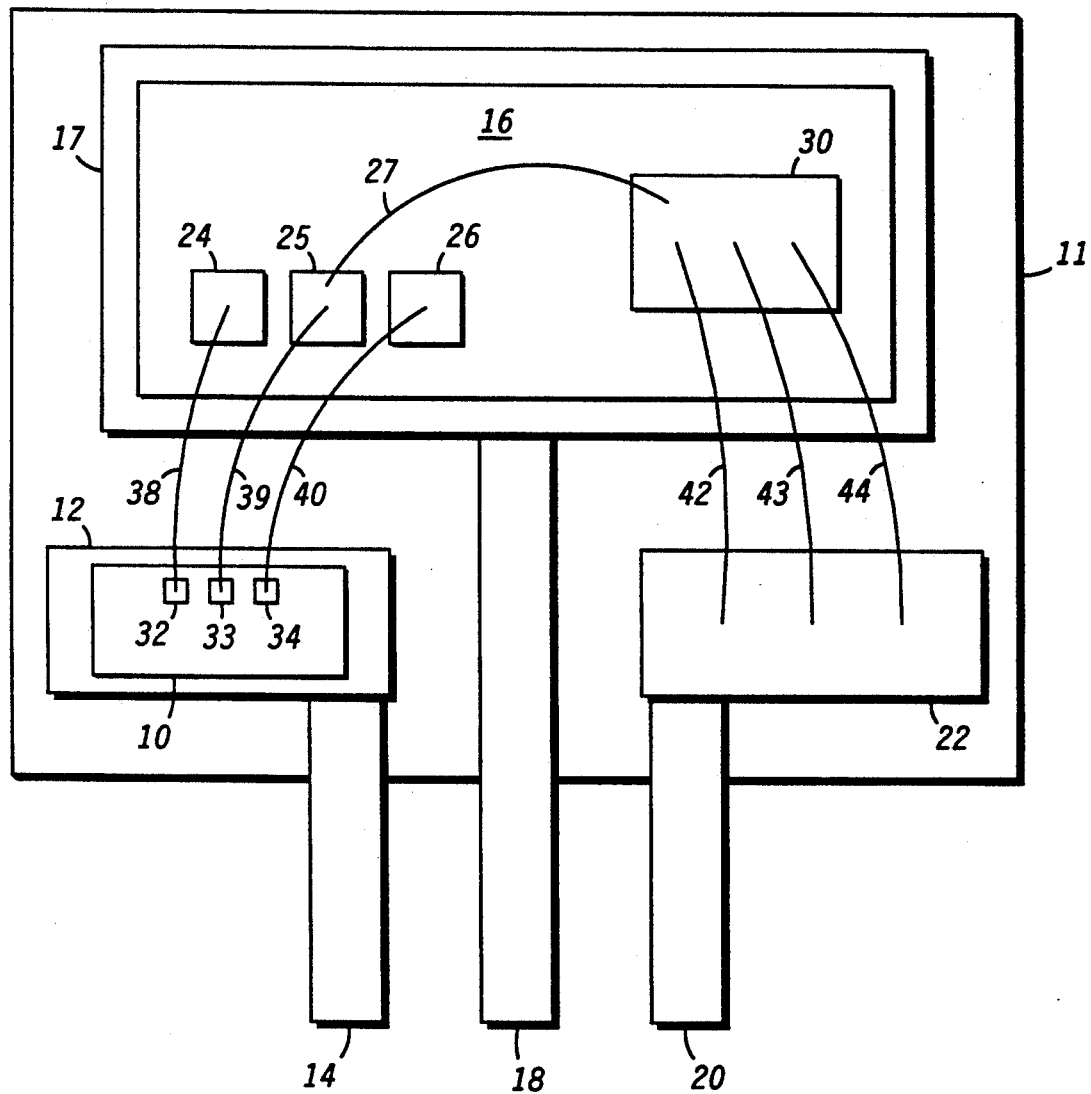

PROTECTION CIRCUIT ON A LEAD OF A POWER DEVICE

FIELD OF THE INVENTION

This invention relates to circuits and, more particularly, to a protection circuit mounted on a lead of a power device.

BACKGROUND OF THE INVENTION

Power devices are utilized in a plurality of circuit applications that require high voltage and current capability, for example, automotive circuits. However, even power devices must be protected from large surge currents which would destroy the device.

Typically, prior art has protected power devices by utilizing external circuitry to monitor the current flowing through the power device. However, this external circuitry requires additional integrated circuits and packaging which can consume expensive space on a circuit board and can be expensive.

Hence, there is a need for a circuit for protecting a power device that is integrated within the packaging of the power device thereby abating the need for additional packaging and space.

SUMMARY OF THE INVENTION

Briefly, there is provided a method for protecting a semiconductor power die having gate, drain, kelvin and source terminals, the semiconductor power die being enclosed in a package having gate, source and drain leads, the source and drain leads being respectively coupled to the source and drain terminals of the semiconductor power die, the method comprising the steps of inserting a control die within the package and between the gate lead of the package and the gate terminal of the semiconductor power die wherein all current flowing through the gate lead must flow through said control die, and coupling the control die to at least the gate and kelvin terminals of the semiconductor power die.

The present invention will be better understood from the following detailed description taken in conjunction with the accompanying drawing.

BRIEF DESCRIPTION OF THE DRAWING

The sole FIGURE is a block diagram illustrating a protection circuit mounted on the control lead of a power device package.

DETAILED DESCRIPTION OF THE DRAWING

Referring to the sole figure, there is illustrated semiconductor package 11 including control die 10 and power semiconductor die 16. It is understood that power semiconductor die 16 includes a power device such as an N-type field effect transistor.

Semiconductor package 11 includes three external leads: gate lead 14, drain lead 18 and source lead 20. Gate lead 14 is coupled to bonding pad 12, and source lead 20 is coupled to bonding pad 22. Further, drain lead 18 is coupled to bonding pad 17.

Power semiconductor die 16 is mounted on bonding pad 17 using standard die bond techniques. Power semiconductor die 16 includes gate terminal 24, kelvin terminal 25, sense terminal 26 and source terminal 30, wherein kelvin terminal 25 is electrically coupled to source terminal 30 as illustrated by wire 27. Control die 10 is attached to bonding pad 12, using standard die bond techniques, and includes terminals 32-34 which are respectively coupled to terminals 24-26 via wire bonds 38-40. Similarly, source terminal 30 of power semiconductor die 16 is coupled to source lead 20 at bonding pad 22 via wire bonds 42-44. It is understood that terminals 32-34 are fabricated on the surface of control die 10. Likewise, terminals 24-26 and 30 are fabricated on the surface of power semiconductor die 16.

The present invention describes a method for inserting a control die between a conventional gate lead of a power device package and the gate terminal of a power semiconductor die. In particular, control die 10 is inserted between gate lead 14 and gate terminal 24. This means that all current flowing through gate lead 14 must pass through control die 10 before charging the gate-to-source capacitance of power semiconductor die 16.

In order to control the current flowing through power semiconductor die 16, control die 10 must be coupled to at least the gate and kelvin terminals (terminals 24 and 25) of power semiconductor die 16. This will allow control die 10 to clamp the maximum gate-to-source voltage of power semiconductor die 16 to a predetermined voltage. It is understood that the source and kelvin terminals of power semiconductor die 16 are electrically coupled wherein the main current path of power semiconductor die 16 is through drain lead 18 to source lead 20. Further, only a small amount of current actually flows through the kelvin terminal thereby creating a small voltage drop between the kelvin and source terminals and, thus, allows for accurate voltage sensing. Also, assuming that power semiconductor die 16 is an N-channel field effect device, kelvin terminal 25 is typically coupled to the most negative voltage applied to the power semiconductor die.

Additionally, terminals 34 and 26 are optional and may be utilized to implement various monitoring means, such as monitoring the magnitude of current flow from drain to source, monitoring the magnitude of voltage drop from drain to source, or monitoring the absolute die temperature of power semiconductor die 16. As an example, a method for monitoring the die temperature is disclosed in U.S. Pat. No. 5,025,298, entitled "SEMICONDUCTOR STRUCTURE WITH CLOSELY COUPLED SUBSTRATE TEMPERATURE SENSE ELEMENT", and issued on Jun. 18, 1991. It should be understood that additional terminals may be added if monitoring more than one of the the above conditions are desired. Further, through the above mentioned monitoring means, circuitry (not shown) may be implemented on control die 10 which would allow detection of any over-stressed condition being monitored, and subsequent orderly turn off of power semiconductor die 16 thereby preventing any damage thereto.

An essential feature of the present invention is that the input of control die 10 is the entire substrate (back side) of the control die 10. Thus, by mounting the back side of control die 10 to bond pad 12, the current flowing through gate lead 14 flows into the input of control die 10 and essentially powers up control die 10. In addition, all protection circuitry (not shown) is fabricated on the surface of control die 10 which is subsequently coupled to power semiconductor die 16 via bonding wires 38-40. Therefore, as current flows through gate lead 14 and control die 10, the voltage appearing across gate terminal 24 and kelvin terminal 25 of power semiconductor die 16 increases until the maximum voltage allowed by circuitry (not shown) on control die 10 is reached.

It is worth noting that if power semiconductor die 16 is an N-type field effect transistor device wherein the gate voltage must be greater than the source voltage for current to flow, control die 10 must be built on an N-type substrate for current to flow where the substrate serves as the most positive potential terminal of control die 10. This is different from most typical IC's which are typically built on a P-type substrate. On the other hand, it should also be understood that if power semiconductor die 16 is a P-type device, then control die 10 may be a standard integrated circuit with a P-type substrate where the substrate serves as the most negative potential terminal of control die 10.

A great advantage of the present invention is that standard packaging techniques can be utilized to mount control die 10 to bonding pad 12. That is, when the die bonding for power semiconductor die 16 is accomplished, control die 10 is simultaneously mounted to bonding pad 12. Thus, the beauty of this invention is that an existing power device package may be used to include protection circuitry by simply mounting control die 10 on bonding pad 12 and including wire bonds 38–40. In other words, control die 10 is mounted inside the existing package containing a power semiconductor die. As a result, no additional circuitry outside the package is required and the control die consumes no additional space on a circuit board.

By now it should be apparent from the foregoing discussion that a novel method for protecting a power device has been provided. The novel method includes mounting an integrated circuit die on the gate lead of a power device package and coupling the integrated circuit die to a power semiconductor die via wire bonds. Thus, any current flowing into the gate lead of the power device must pass through the integrated circuit die. Thus the integrated circuit die can control the power semiconductor die.

Additionally, the integrated circuit die can monitor other conditions present on the power semiconductor die thereby detecting over-stressed conditions. While the invention has been described in conjunction with the specific embodiments thereof, it is evident that many alterations, modifications and variations will be apparent to those skilled in the art in the light of the foregoing description. Accordingly, it is intended to embrace all such alterations, modifications and variations in the appended claims.

We claim:

1. A method for protecting a semiconductor power die having gate, drain, kelvin and source and at least one sense terminals, the semiconductor power die being enclosed in a package having gate, source and drain leads, the source and drain leads being respectively coupled to the source and drain terminals of the semiconductor power die, the method comprising the steps of:
   (a) mounting a backside of a control die on a bonding pad located between the gate lead of the package and the gate terminal of the semiconductor power die wherein said backside of said control die is the input of said control die and wherein a signal flowing through the gate lead of the package activates and powers up said control die; and
   (b) coupling said control die to at least the gate and kelvin terminals of the semiconductor power die.

2. The method for protecting the semiconductor power die according to claim 1 further includes:
   coupling said control die to at least one of the sense terminals of the semiconductor power die.

3. The method for protecting the semiconductor power die according to claim 1 wherein said control die is fabricated on an N-type substrate.

4. A circuit being enclosed in a package, the package having first, second and third leads, the circuit comprising:
   a semiconductor power die having gate, drain, kelvin, source and at least one sense terminals, the first and second leads of the package being respectively coupled to said source and drain terminals of said semiconductor power die; and
   a control die being fabricated on a substrate where said substrate acts as an input of said control die and where a plurality of terminals are fabricated on a topside of said control die, said substrate of said control die being mounted on a bonding pad located between said third lead of the package and said gate terminal of said semiconductor power die such that a current flowing through said third lead flows into said input of said control die thereby powering up said control die, a first one of said plurality of terminals being coupled to said gate terminal of said semiconductor power die, a second one of said plurality of terminals being coupled to said kelvin terminal of said semiconductor power die.

5. The circuit according to claim 4 further including a third one of said plurality of terminals being coupled to said at least sense terminal of said semiconductor power die.

6. The circuit according to claim 4 wherein said substrate of said control die is N-type.

* * * * *